(12) United States Patent
Kim

(10) Patent No.: US 7,303,955 B2
(45) Date of Patent: Dec. 4, 2007

(54) SEMICONDUCTOR MEMORY DEVICE WITH HIGH OPERATING CURRENT AND METHOD OF MANUFACTURING THE SAME

(75) Inventor: Wook-je Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 128 days.

(21) Appl. No.: 11/300,233

(22) Filed: Dec. 14, 2005

(65) Prior Publication Data

US 2006/0189051 A1     Aug. 24, 2006

(30) Foreign Application Priority Data

Feb. 21, 2005   (KR) .................... 10-2005-0014091

(51) Int. Cl.
*H01L 21/336* (2006.01)
(52) U.S. Cl. .............. 438/257; 257/500; 257/369; 257/E29.324
(58) Field of Classification Search ........... 257/369, 257/500, 640, E29.324; 438/257
See application file for complete search history.

(56) References Cited

U.S. PATENT DOCUMENTS

| | | | |
|---|---|---|---|
| 5,291,052 A | 3/1994 | Kim et al. ............. | 257/369 |
| 6,573,172 B1 | 6/2003 | En et al. ............... | 438/626 |
| 7,053,400 B2 * | 5/2006 | Sun et al. ............. | 257/19 |
| 7,105,394 B2 * | 9/2006 | Hachimine et al. ..... | 438/197 |
| 7,109,568 B2 * | 9/2006 | Kumagai et al. ....... | 257/627 |
| 7,214,629 B1 * | 5/2007 | Luo et al. .............. | 438/778 |

FOREIGN PATENT DOCUMENTS

| JP | 09-129875 | 5/1997 |
|---|---|---|
| JP | 2002-198368 | 7/2002 |

OTHER PUBLICATIONS

"A 90nm High Volume Manufacturing Logic Technology Featuring Novel 45nm Gate Length Strained Silicon CMOS Transistors", by T. Ghani, et al., 2003, IEDM Tech. Dig., pp. 11.6.1-11.6.3.

* cited by examiner

*Primary Examiner*—Trung Dang
(74) *Attorney, Agent, or Firm*—Mills & Onello LLP

(57) ABSTRACT

In a semiconductor memory device with a high operating current and a method of manufacturing the same, a semiconductor substrate is formed in which a memory cell region and a peripheral circuit region including an N-channel metal oxide semiconductor (NMOS) region and a P-channel metal oxide semiconductor (PMOS) region are defined. A gate electrode with sidewall spacers is formed in each of the memory cell region and the peripheral circuit region. Source and drain regions are formed in the semiconductor substrate at sides of the gate electrode to form metal oxide semiconductor (MOS) transistors. A first etch stop layer is formed on the semiconductor substrate where the MOS transistors are formed. A second etch stop layer is selectively formed in the NMOS region of the peripheral circuit region.

22 Claims, 4 Drawing Sheets

SEMICONDUCTOR MEMORY DEVICE WITH HIGH OPERATING CURRENT AND METHOD OF MANUFACTURING THE SAME

BACKGROUND OF THE INVENTION

This application claims the priority of Korean Patent Application No. 10-2005-0014091, filed on Feb. 21, 2005, in the Korean Intellectual Property Office, the disclosure of which is incorporated herein in its entirety by reference.

1. Field of the Invention

The present invention relates to a semiconductor memory device and a method of manufacturing the same, and more particularly, to a semiconductor memory device with a high operating current and a method of manufacturing the same.

2. Description of the Related Art

It is well known that the performance of a transistor largely depends on an operating current of the transistor. Accordingly, methods to obtain high operating current in transistors are continuously being studied. One such approach is referred to as strained silicon channel (SSC) technology, in which stress is applied to a channel region.

SCC technology provides a strained channel layer by forming a stress-applying layer on a metal oxide silicon field effect transistor (MOSFET). A description of SSC technology is disclosed in the article "A 90 nm High Volume Manufacturing Logic Technology Featuring Novel 45 nm Gate Length Strained Silicon CMOS Transistor" by T. Ghani et al., 2003, IEEE.

In general, layers that induce stress on a channel formed on a silicon substrate include a silicon germanium layer and a silicon nitride layer. An etch stop layer made of silicon nitride formed on a transistor that constitutes a semiconductor memory device, for example, a dynamic random access memory (DRAM), is used as a stress applying layer.

However, a stress applying layer (etch stop layer) made of silicon nitride that induces tensile stress increases mobility of an N-channel metal oxide semiconductor (NMOS) transistor but decreases mobility of a P-channel metal oxide semiconductor (PMOS) transistor. Accordingly, in a semiconductor memory device including both an NMOS transistor and the PMOS transistor, if the thickness of the etch stop layer made of silicon nitride is increased to improve the mobility of the NMOS transistor, the operating current of the NMOS transistor increases but the operating current of the PMOS transistor decreases, thereby failing to improve the operating currents of both type of transistors of the semiconductor memory device.

In the meantime, an applied stress layer that induces a compressive stress increases the mobility of the PMOS transistor but decreases the mobility of the NMOS transistor.

Further, if the thickness of the etch stop layer is increased, it is difficult to form self-aligned contact pads that are connected to source and drain regions in a memory cell region of the semiconductor memory device (e.g., DRAM).

SUMMARY OF THE INVENTION

The present invention provides a method of manufacturing a semiconductor memory device, which can increase the mobility of both an NMOS transistor and a PMOS transistor and can readily form self-aligned contact pads in a memory cell region.

The present invention also provides a semiconductor memory device obtained by the semiconductor memory device manufacturing method.

In one aspect, the present invention is directed to a method of manufacturing a semiconductor memory device, the method comprising: providing a semiconductor substrate in which a memory cell region and a peripheral circuit region including an NMOS region and a PMOS region are defined; forming a gate electrode with sidewall spacers in the memory cell region and forming a gate electrode with sidewall spacers in each of the NMOS region and the PMOS region of the peripheral circuit region; forming source and drain regions in the semiconductor substrate at sides of the gate electrodes to form MOS transistors; forming a first etch stop layer on the semiconductor substrate where the MOS transistors are formed; and selectively forming a second etch stop layer in the NMOS region of the peripheral circuit region.

In one embodiment, selectively forming the second etch stop layer comprises: forming a first interlayer insulating layer on the first etch stop layer; etching the first interlayer insulating layer to expose a portion of the first etch stop layer in the NMOS region; forming a second-etch stop layer on upper surfaces and side surfaces of the exposed first interlayer insulating layer and on an upper surface of the first etch stop layer; forming a second interlayer insulating layer on the second etch stop layer; and planarizing the second interlayer insulating layer and the second etch stop layer.

In another embodiment, each of the first and second etch stop layers comprises a silicon nitride layer formed, for example, using a furnace method or a chemical vapor deposition (CVD) method. In another embodiment, each of the first and second etch stop layers has a thickness of 50 to 1000 Å.

In another embodiment, the method further comprises, after planarizing: forming first contact pads in the first interlayer insulating layer to expose the source and drain regions in the memory cell region; forming a third interlayer insulating layer on the semiconductor substrate where the first contact pads are formed; and forming second contact pads in the second and third interlayer insulating layers to expose the source and drain regions of the transistor in the NMOS region.

In another embodiment, forming the second contact pads comprises: forming contact holes that are self-aligned by a second etch stop layer portion formed on a side wall of the first interlayer insulating layer and by a second etch stop layer portion formed on a surface of each of the sidewall spacers; and forming second contact pads by depositing a conductive material in the contact holes.

In another aspect, the present invention is directed to a semiconductor memory device comprising: a semiconductor substrate in which a memory cell region and a peripheral circuit region including an NMOS region and a PMOS region are defined; a MOS transistor in each of the memory cell region and the peripheral circuit region, including a gate electrode with sidewall spacers, a source region, and a drain region; an etch stop layer on the semiconductor substrate where the MOS transistors are formed; and an interlayer insulating layer on the etch stop layer, wherein each of etch stop layer portions in the memory cell region and the PMOS region is thicker than an etch stop layer portion in the NMOS region.

In one embodiment, the etch stop layer comprises a silicon nitride layer.

In another embodiment, the device further comprises first contact pads formed in the interlayer insulating layer to expose the source and drain regions of the memory cell region, and second contact pads formed in the interlayer insulating layer to expose the source and drain regions of the transistor in the NMOS region.

In another embodiment, ends of the etch stop layer are at boundary surfaces of the NMOS region and extend in a direction that is perpendicular to a surface of the substrate.

In another embodiment, each of the second contact pads is disposed between an etch stop layer portion perpendicular to the surface of the substrate and an etch stop layer portion formed on a surface of each of the sidewall spacers.

In another aspect, the present invention is directed to a semiconductor memory device comprising: a semiconductor substrate in which a memory cell region and a peripheral circuit region including an NMOS region and a PMOS region are defined; a MOS transistor in each of the memory cell region and the peripheral circuit region, including a gate electrode with sidewall spacers, a source region, and a drain region; a first etch stop layer formed on the semiconductor substrate where the MOS transistors are formed; a second etch stop layer selectively formed on the NMOS region; an interlayer insulating layer formed on each of the first etch stop layer and the second etch stop layer; first contact pads formed in the interlayer insulating layer to expose the source and drain regions of transistors in the memory cell region; and second contact pads formed in the interlayer insulating layer to expose the source and drain regions of transistors in the NMOS region.

In one embodiment, each of the first and second etch stop layers comprises a silicon nitride layer.

In another embodiment, ends of the second etch stop layer are extended at boundary surfaces of the NMOS region and extend in a direction that is perpendicular to a surface of the substrate.

In another embodiment, each of the second contact pads is disposed between an etch stop layer portion perpendicular to the surface of the substrate and an etch stop layer portion formed on a surface of each of the sidewall spacers.

In another aspect, the present invention is directed to a method of manufacturing a semiconductor memory device, the method comprising: providing a semiconductor substrate in which a memory cell region and a peripheral circuit region including an NMOS region and a PMOS region are defined; forming a gate electrode with sidewall spacers in the memory cell region and forming a gate electrode with sidewall spacers in each of the NMOS region and the PMOS region of the peripheral circuit region; forming source and drain regions on the semiconductor substrate at sides of the gate electrodes to form MOS transistors; forming a first etch stop layer on the semiconductor substrate where the MOS transistors are formed; and selectively forming a second etch stop layer on the PMOS region of the peripheral circuit region.

In one embodiment, each of the first and second etch stop layers comprises a layer that applies a compressive stress to the semiconductor substrate.

In another embodiment, selectively forming the second etch stop layer comprises: forming a first interlayer insulating layer on the first etch stop layer; etching the first interlayer insulating layer to expose a portion of the first etch stop layer in the PMOS region; forming the second etch stop layer on upper surfaces and side surfaces of the exposed first interlayer insulating layer and on an upper surface of the first etch stop layer; forming a second interlayer insulating layer on the second etch stop layer; and planarizing the second interlayer insulating layer and the second etch stop layer.

In another aspect, the present invention is directed to a semiconductor memory device comprising: a semiconductor substrate in which a memory cell region and a peripheral circuit region including an NMOS region and a PMOS region are defined; a MOS transistor on each of the memory cell region and the peripheral circuit region, including a gate electrode with sidewall spacers, a source region, and a drain region; an etch stop layer on the semiconductor substrate where the MOS transistors are formed; and an interlayer insulating layer on the etch stop layer, wherein each of etch stop layer portions in the memory cell region and the NMOS region is thicker than an etch stop layer portion on the PMOS region.

In one embodiment, the etch stop layer comprises a layer that applies a compressive stress to the semiconductor substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
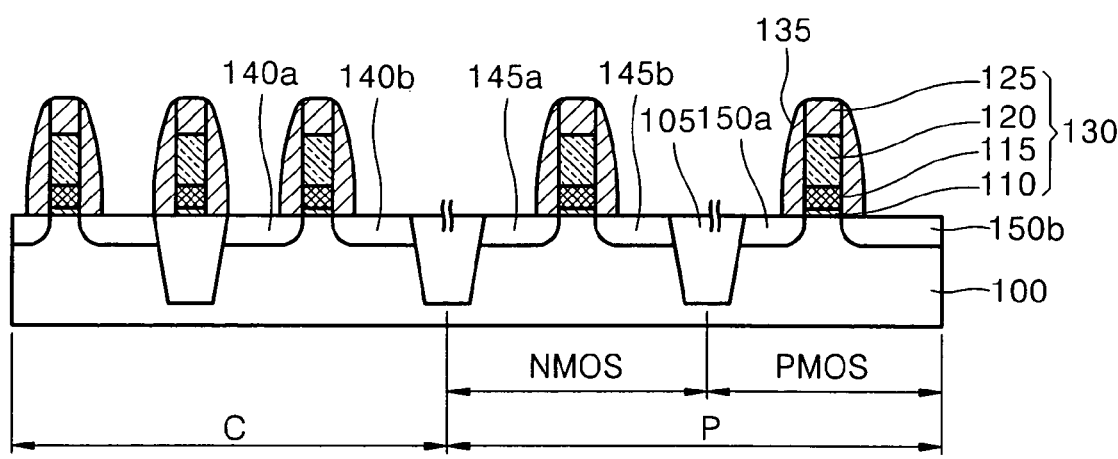
FIGS. 1 through 7 are cross-sectional views illustrating a method of manufacturing a semiconductor memory device.

The present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification. The shapes of elements in the drawings are exaggerated for the convenience of explanation.

According to a semiconductor memory device illustrated in the embodiments of the present invention, to increase the operating currents, that is, the mobilities, of both an N-type metal oxide semiconductor (NMOS) transistor and a P-type metal oxide semiconductor (PMOS) transistor in a common peripheral circuit region and easily form self-aligned contact pads in a memory cell region, an etch stop layer portion (referred to as an NMOS region hereinafter) where the NMOS transistor is formed is thicker than an etch stop layer portion (referred to as a PMOS region hereinafter) where the PMOS transistor is formed and an etch stop layer portion in the memory cell region. Accordingly, while the mobility of the NMOS transistor is increased, the mobility of the PMOS transistor is maintained. Also, since the etch stop layer portion in the memory cell region is thinner than the etch stop layer portion in the NMOS region, contact holes can be readily formed, thereby easily forming contact studs.

A method of manufacturing the semiconductor memory device will now be explained with reference to FIGS. 1 through 6.

Referring to FIG. 1, an isolation layer 105, for example, a shallow trench isolation (STI) layer, is formed within a semiconductor substrate 100 using well-known formation methods to define a memory cell region C, and a peripheral circuit region P that includes an NMOS region NMOS and a PMOS region PMOS. The peripheral circuit region P may include a core region. A gate oxide layer 110, a doped polysilicon layer 115, a transition metal silicide layer 120, and a hard mask layer 125 are sequentially stacked on the semiconductor substrate 100 in which the memory cell region C and the peripheral circuit region P are defined. The hard mask layer 125, the transition metal silicide layer 120, and the doped polysilicon layer 115 are partially patterned to form gate electrodes 130 in the memory cell region C and the NMOS region NMOS and the PMOS region PMOS of the peripheral circuit region P. Next, insulator spacers 135 are formed on both side walls of each of the gate electrodes 130 using a well-known method. Thereafter, an impurity is selectively implanted into the semiconductor substrate 100 outside the sidewall spacers 135 to form source regions 140a, 145a, and 150a, and drain regions 140b, and 145b and 150b, thereby creating MOS transistors. An N-type impurity, such as phosphorus (P) or arsenic (As), may be implanted into the memory cell region C and the NMOS region NMOS to form N-type source regions 140a and 145a and N-type drain regions 140b and 145b, and a P-type impurity, such as boron (B), may be implanted into the PMOS region PMOS to form P-type source and drain regions 150a and 150b, respectively.

Figure 2:
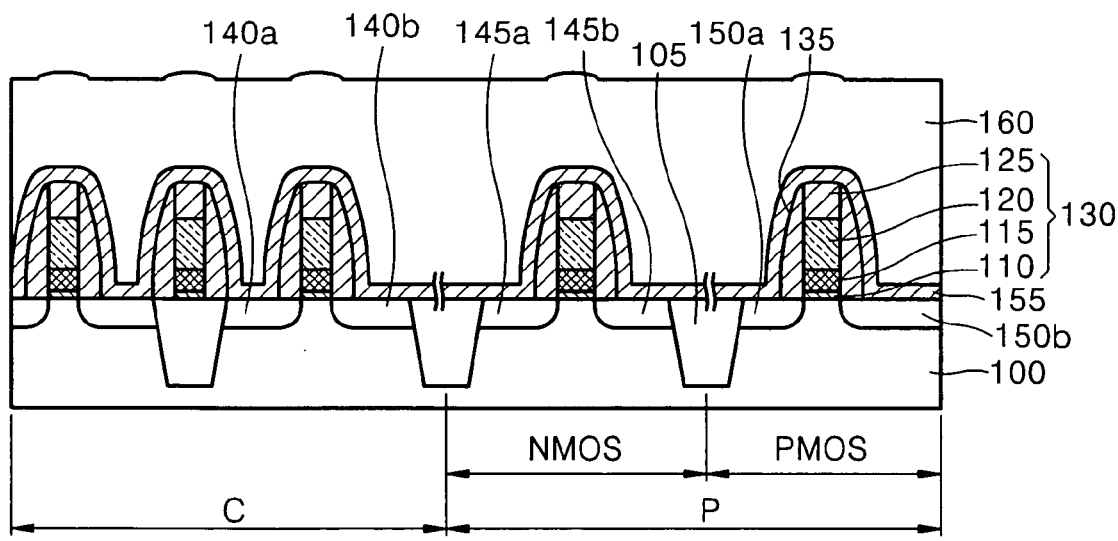

Referring to FIG. 2, a first etch stop layer 155 is evenly coated on the resultant semiconductor substrate 100 on which the MOS transistors are formed. The first etch stop layer 155 comprises, for example, a silicon nitride layer formed that is applied using a furnace method or a chemical vapor deposition (CVD) method. The first etch stop layer 155 may be deposited to a thickness of 50 to 1000 Å. A first interlayer insulating layer 160 is deposited on the first etch stop layer 155 to a predetermined thickness. The first interlayer insulating layer 160 may comprise a silicon oxide layer.

Figure 3:
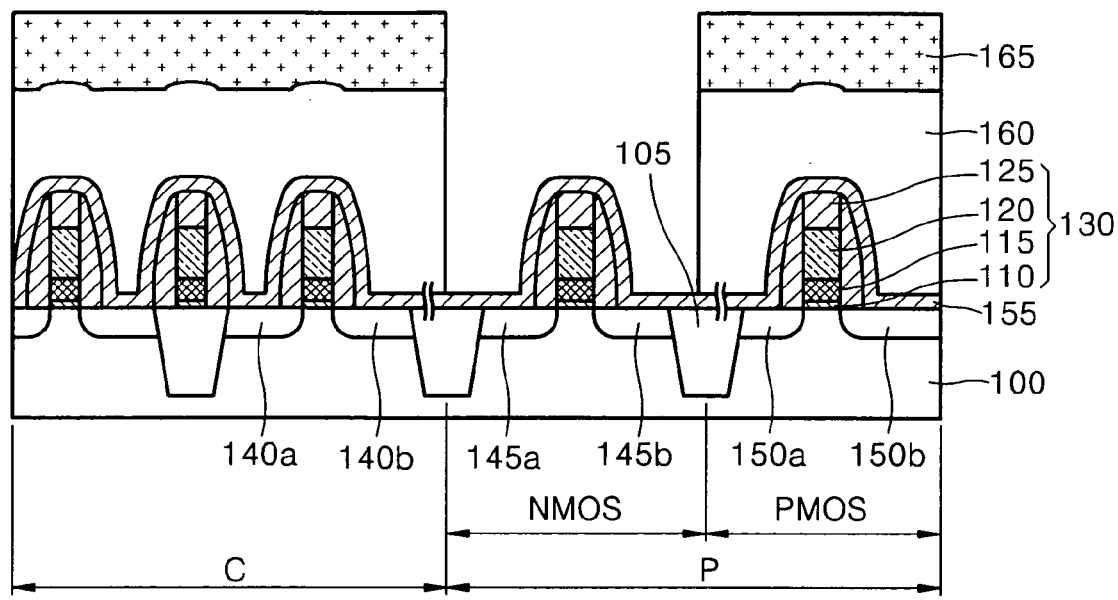

Next, referring to FIG. 3, a photoresist pattern 165 is formed using a well-known photolithography process on the first interlayer insulating layer 160 to expose the NMOS region NMOS of the peripheral circuit region P. Using the photoresist pattern 165 as a mask, the first interlayer insulating layer 160 is etched to expose a portion of the first etch stop layer 155 in the NMOS region NMOS. The first interlayer insulating layer 160 in the NMOS region may be anisotropically etched using a dry etching method or a dry/wet etching method so that the first interlayer insulating layer 160 in the memory cell region and the PMOS region PMOS adjacent to the NMOS region NMOS can be retained.

Figure 4:
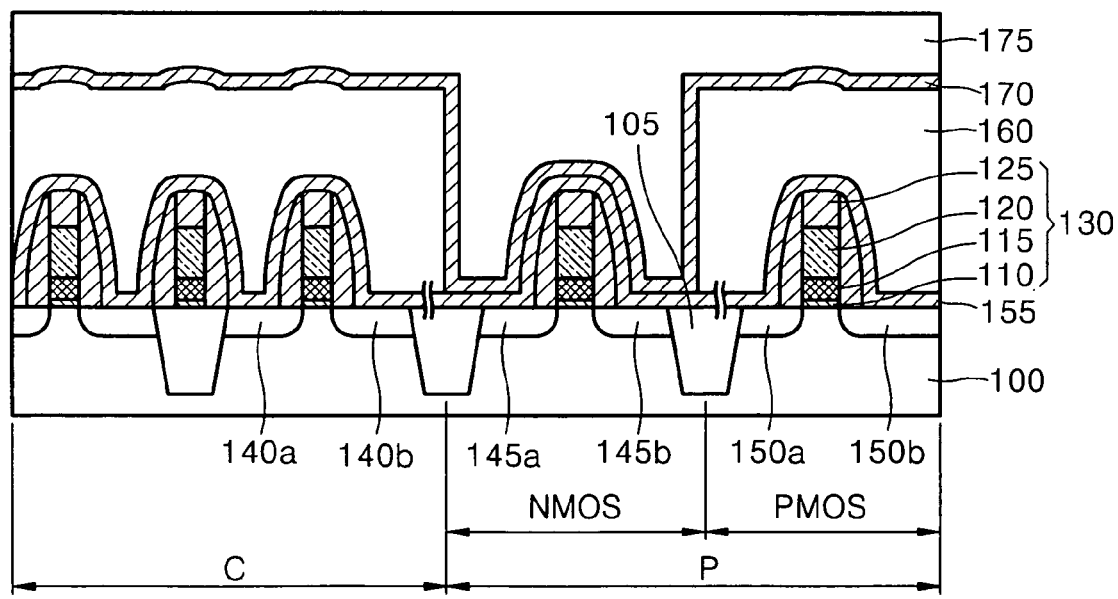

Referring to FIG. 4, the photoresist pattern 165 is removed using a well-known method. Next, a second etch stop layer 170 is deposited on upper surfaces and side surfaces of the exposed first interlayer insulating layer 160 and on an upper surface of the exposed portion of the first etch stop layer 155 to a thickness of approximately 50 to 1000 Å. The second etch stop layer 170 applies stress to the NMOS transistor, and comprises, for example, a silicon nitride layer like the first etch stop layer 155. The second etch stop layer 170 can be formed using a furnace method to apply, together with the first etch stop layer 155, sufficient stress to the NMOS transistor. As the second etch stop layer 170 is formed in the NMOS region NMOS, the thickness of the layers that apply stress to the NMOS transistor in the NMOS region NMOS is increased.

Next, a second interlayer insulating layer 175 is deposited on the second etch stop layer 170. The second interlayer insulating layer 175 may be a silicon oxide layer like the first interlayer insulating layer 160, and may be deposited to a thickness that is sufficient to bury the NMOS region NMOS.

Figure 5:
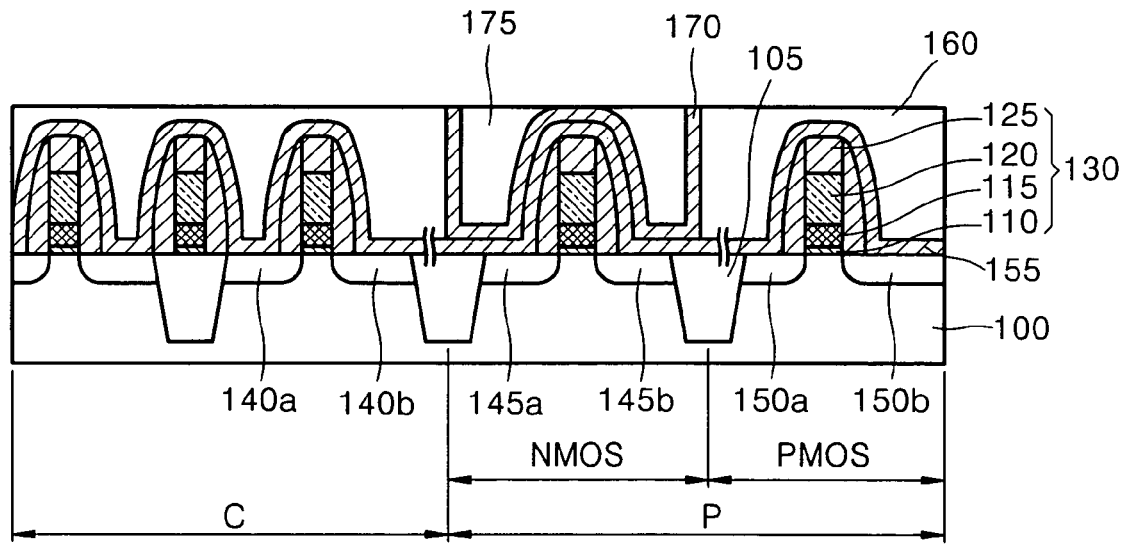

Referring to FIG. 5, the second interlayer insulating layer 175 and the second etch stop layer 170 are planarized by chemical mechanical polishing (CMP) to expose a surface of the second etch stop layer 170 on the gate electrode 130. Alternatively, a CMP process and an etch back process may be performed simultaneously so that the surface of the second etch stop layer 170 between the first interlayer insulating layer 160 and the second interlayer insulating layer 175 can be exposed. Accordingly, ends of the second etch stop layer 170 extend in boundaries of the NMOS region in a direction that is substantially perpendicular to a surface of the substrate 100.

Figure 6:
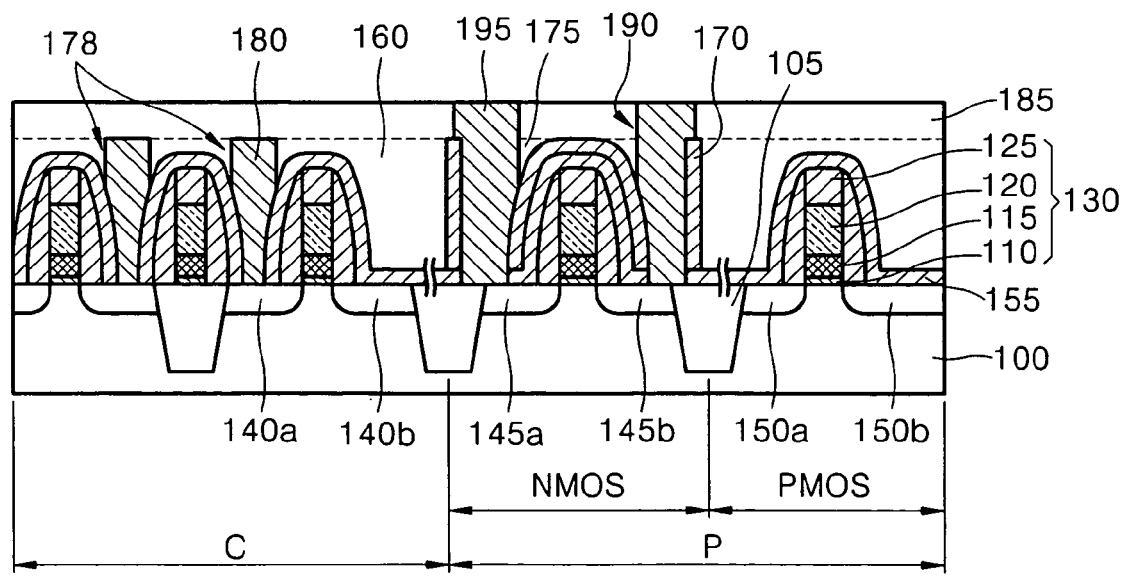

Next, referring to FIG. 6, the first interlayer insulating layer 160 is etched to expose the source and drain regions 140a and 140b respectively in the memory cell region C, thereby forming contact holes 178. Next, a conductive material, for example, a doped polysilicon layer, is deposited in the contact holes 178 to form first contact pads 180. A third interlayer insulating layer 185 is deposited on the resultant semiconductor substrate 100 with the first contact pads 180 formed in the memory cell region C. The third interlayer insulating layer 185 comprises, for example, a silicon oxide layer similar to the first and second interlayer insulating layers 160 and 175, respectively. The third interlayer insulating layer 185 is planarized to a predetermined thickness. Here, the first contact pads 180 may be formed before the second etch stop layer 170 is formed.

Next, contact holes 190 are formed in the second and third interlayer insulating layers 175 and 185, respectively, using a photolithography process and an etching process to expose the source and drain regions 145a and 145b respectively in the NMOS region NMOS. Since the first and second etch stop layers 155 and 170 respectively have an etching selectivity different from that of-the interlayer insulating layers 175 and 185, and since the second etch stop layers 170 are formed on the side is walls of the adjacent first interlayer insulating layers 160, each of the contact holes 190 can be formed in a self-aligned manner due to the presence of the second etch stop layer portion that is formed on the side wall of the first interlayer insulating layer 160 and due to the presence of the second etch stop layer portion that is formed on a surface of each of the sidewall spacers 135. Accordingly, the margin of photolithography is increased, and thus the area of an active region in the NMOS region can be reduced. Next, a conductive material, for example, a polysilicon layer, is deposited in the contact holes to form second contact pads 195.

According to the present embodiment, to improve the mobility of the NMOS transistor in the peripheral circuit region, an etch stop layer is formed as a tensile stress applying layer, and the etch stop layer portion in the NMOS region is thicker than the etch stop layer portion in the PMOS region. However, the present invention is not limited the above embodiment. For example, in another embodiment, the etch stop layer may be formed as a compressive stress applying layer to increase the mobility of the PMOS transistor and a compressive stress applying layer portion in the PMOS region may be thicker than a compressive stress applying layer in the NMOS region.

Figure 7:
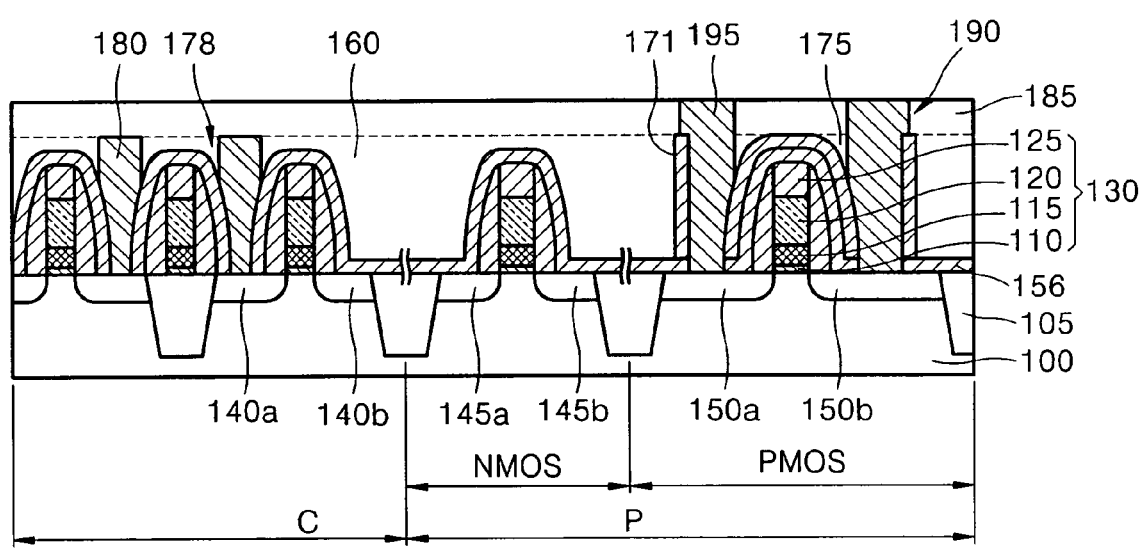

That is, referring to FIG. 7, a first etch stop layer 156, which is a compressive stress applying layer, and the first interlayer insulating layer 160 are formed over the cell region C and the peripheral circuit region P. Next, the first interlayer insulating layer 160 is selectively removed to expose a portion of the first etch stop layer portion 156 in the PMOS region PMOS of the peripheral circuit region P. Next, a second etch stop layer 171, which is a compressive stress applying layer, is formed on the first etch stop layer portion 156 in the exposed PMOS region PMOS, and contact pads are formed using the same method as described above.

In this case, since the etch stop layers 156 and 171 are layers that apply a compressive stress and the etch stop layers 156 and 171 in the PMOS region PMOS are relatively thicker, the mobility of the PMOS transistor is increased and the mobility of the NMOS transistor is maintained.

As described above, according to the present invention, the thickness of either the etch stop layer portion in the NMOS region or the etch stop layer portion in the PMOS region of the peripheral circuit region of the memory device-is increased. Accordingly, if the etch stop layer portion in the NMOS region is increased, stress applied to the NMOS transistor of the peripheral circuit region is increased, the mobility of the NMOS transistor is increased, and the operating current of the NMOS transistor is increased.

In the meantime, since the thicknesses of the etch stop layer portions in the memory cell region and the PMOS region are not increased, the contact pads can be readily formed in the memory cell region and the mobility of the PMOS transistor is not reduced. Consequently, the operating current of the semiconductor memory device is increased.

Moreover, since the second etch stop layer portions are formed on the side walls of the interlayer insulating layer in the NMOS region, the contact pads of the NMOS transistor can be self-aligned, the margin of photolithography for forming the contact holes can be improved, and the area of the active region in the NMOS region can be reduced. A case when the etch stop layer region in the PMOS region is increased is similar to the above example and thus a description will be omitted.

While the present invention has been particularly shown and described with reference to exemplary embodiments thereof, it will be understood by those of ordinary skill in the art that various changes in form and details may be made herein without departing from the spirit and scope of the present invention as defined by the following claims.

What is claimed is:

1. A method of manufacturing a semiconductor memory device, the method comprising:
   providing a semiconductor substrate in which a memory cell region and a peripheral circuit region including an NMOS region and a PMOS region are defined;
   forming a gate electrode with sidewall spacers in the memory cell region and forming a gate electrode with sidewall spacers in each of the NMOS region and the PMOS region of the peripheral circuit region;
   forming source and drain regions in the semiconductor substrate at sides of the gate electrodes to form MOS transistors;
   forming a first etch stop layer on the semiconductor substrate where the MOS transistors are formed; and
   selectively forming a second etch stop layer in the NMOS region of the peripheral circuit region.

2. The method of claim 1, wherein selectively forming the second etch stop layer comprises:
   forming a first interlayer insulating layer on the first etch stop layer;
   etching the first interlayer insulating layer to expose a portion of the first etch stop layer in the NMOS region;
   forming a second etch stop layer on upper surfaces and side surfaces of the exposed first interlayer insulating layer and on an upper surface of the first etch stop layer;
   forming a second interlayer insulating layer on the second etch stop layer; and
   planarizing the second interlayer insulating layer and the second etch stop layer.

3. The method of claim 1, wherein each of the first and second etch stop layers comprises a silicon nitride layer.

4. The method of claim 3, wherein the silicon nitride layer is formed using a furnace method.

5. The method of claim 3, wherein the silicon nitride layer is formed using a chemical vapor deposition (CVD) method.

6. The method of claim 1, wherein each of the first and second etch stop layers has a thickness of 50 to 1000 Å.

7. The method of claim 2, further comprising, after planarizing:
   forming first contact pads in the first interlayer insulating layer to expose the source and drain regions in the memory cell region;
   forming a third interlayer insulating layer on the semiconductor substrate where the first contact pads are formed; and
   forming second contact pads in the second and third interlayer insulating layers to expose the source and drain regions of the transistor in the NMOS region.

8. The method of claim 7, wherein forming the second contact pads comprises:
   forming contact holes that are self-aligned by a second etch stop layer portion formed on a side wall of the first interlayer insulating layer and by a second etch stop layer portion formed on a surface of each of the sidewall spacers; and
   forming second contact pads by depositing a conductive material in the contact holes.

9. A semiconductor memory device comprising:
   a semiconductor substrate in which a memory cell region and a peripheral circuit region including an NMOS region and a PMOS region are defined;
   a MOS transistor in each of the memory cell region and the peripheral circuit region, including a gate electrode with sidewall spacers, a source region, and a drain region;
   an etch stop layer on the semiconductor substrate where the MOS transistors are formed; and
   an interlayer insulating layer on the etch stop layer,
   wherein each of etch stop layer portions in the memory cell region and the PMOS region is thinner than an etch stop layer portion in the NMOS region.

10. The semiconductor memory device of claim 9, wherein the etch stop layer comprises a silicon nitride layer.

11. The semiconductor memory device of claim 9, further comprising first contact pads formed in the interlayer insulating layer to expose the source and drain regions of the memory cell region, and second contact pads formed in the interlayer insulating layer to expose the source and drain regions of the transistor in the NMOS region.

12. The semiconductor memory device of claim 9, wherein ends of the etch stop layer are at boundary surfaces of the NMOS region and extend in a direction that is perpendicular to a surface of the substrate.

13. The semiconductor memory device of claim 12, wherein each of the second contact pads is disposed between an etch stop layer portion perpendicular to the surface of the substrate and an etch stop layer portion formed on a surface of each of the sidewall spacers.

14. A semiconductor memory device comprising:
   a semiconductor substrate in which a memory cell region and a peripheral circuit region including an NMOS region and a PMOS region are-defined;
   a MOS transistor in each of the memory cell region and the peripheral circuit region, including a gate electrode with sidewall spacers, a source region, and a drain region;
   a first etch stop layer formed on the semiconductor substrate where the MOS transistors are formed;
   a second etch stop layer selectively formed on the NMOS region;

an interlayer insulating layer formed on each of the first etch stop layer and the second etch stop layer;

first contact pads formed in the interlayer insulating layer to expose the source and drain regions of transistors in the memory cell region; and second contact pads formed in the interlayer insulating layer to expose the source and drain regions of transistors in the NMOS region.

15. The semiconductor memory device of claim 14, wherein each of the first and second etch stop layers comprises a silicon nitride layer.

16. The semiconductor memory device of claim 14, wherein ends of the second etch stop layer are extended at boundary surfaces of the NMOS region and extend in a direction that is perpendicular to a surface of the substrate.

17. The semiconductor memory device of claim 14, wherein each of the second contact pads is disposed between an etch stop layer portion perpendicular to the surface of the substrate and an etch stop layer portion formed on a surface of each of the sidewall spacers.

18. A method of manufacturing a semiconductor memory device, the method comprising:

providing a semiconductor substrate in which a memory cell region and a peripheral circuit region including an NMOS region and a PMOS region are defined;

forming a gate electrode with sidewall spacers in the memory cell region and forming a gate electrode with sidewall spacers in each of the NMOS region and the PMOS region of the peripheral circuit region;

forming source and drain regions on the semiconductor substrate at sides of the gate electrodes to form MOS transistors;

forming a first etch stop layer on the semiconductor substrate where the MOS transistors are formed; and selectively forming a second etch stop layer on the PMOS region of the peripheral circuit region.

19. The method of claim 18, wherein each of the first and second etch stop layers comprises a layer that applies a compressive stress to the semiconductor substrate.

20. The method of claim 18, wherein selectively forming the second etch stop layer comprises:

forming a first interlayer insulating layer on the first etch stop layer;

etching the first interlayer insulating layer to expose a portion of the first etch stop layer in the PMOS region;

forming the second etch stop layer on upper surfaces and side surfaces of the exposed first interlayer insulating layer and on an upper surface of the first etch stop layer;

forming a second interlayer insulating layer on the second etch stop layer; and planarizing the second interlayer insulating layer and the second etch stop layer.

21. A semiconductor memory device comprising:

a semiconductor substrate in which a memory cell region and a peripheral circuit region including an NMOS region and a PMOS region are defined;

a MOS transistor on each of the memory cell region and the peripheral circuit region, including a gate electrode with sidewall spacers, a source region, and a drain region;

an etch stop layer on the semiconductor substrate where the MOS transistors are formed; and an interlayer insulating layer on the etch stop layer, wherein each of etch stop layer portions in the memory cell region and the NMOS region is thinner than an etch stop layer portion on the PMOS region.

22. The semiconductor memory device of claim 21, wherein the etch stop layer comprises a layer that applies a compressive stress to the semiconductor substrate.

* * * * *